United States Patent [19]

Klug et al.

[11] Patent Number: 4,540,650
[45] Date of Patent: Sep. 10, 1985

[54] PHOTORESISTS SUITABLE FOR FORMING RELIEF STRUCTURES OF HIGHLY HEAT-RESISTANT POLYMERS

[75] Inventors: Rudolf Klug, Aschaffenburg; Hartmut Härtner, Mühltal; Hans-Joachim Merrem, Seeheim; Karl H. Neisius, Darmstadt, all of Fed. Rep. of Germany

[73] Assignee: Merke Patent Gesellschaft mit beschrankter Haftung, Darmstadt, Fed. Rep. of Germany

[21] Appl. No.: 531,781

[22] Filed: Sep. 13, 1983

[30] Foreign Application Priority Data

Sep. 13, 1982 [DE] Fed. Rep. of Germany ....... 3233912

[51] Int. Cl.$^3$ .......................... G03C 1/70; G03C 5/16; C08G 69/48
[52] U.S. Cl. .................................. 430/281; 430/283; 430/287; 430/288; 430/326; 430/330; 430/18; 204/159.15; 525/421; 525/426
[58] Field of Search ............... 430/288, 281, 283, 284, 430/285, 287, 326, 330, 18; 204/159.15, 159.19; 525/421, 426

[56] References Cited

U.S. PATENT DOCUMENTS

| | | | |
|---|---|---|---|
| Re. 30,186 | 1/1980 | Rubner et al. | 430/325 |
| 3,825,430 | 7/1974 | Kurka | 430/287 |
| 3,843,572 | 10/1974 | Morgan | 430/288 |
| 3,957,512 | 5/1976 | Kleeberg et al. | 96/35.1 |
| 4,045,223 | 8/1977 | Rubner et al. | 96/35.1 |
| 4,088,489 | 5/1978 | Rubner et al. | 96/35.1 |
| 4,291,142 | 9/1981 | Tamura et al. | 204/159.19 |
| 4,310,641 | 1/1982 | Ohmura et al. | 204/159.19 |
| 4,329,419 | 5/1982 | Goff et al. | 430/288 |

FOREIGN PATENT DOCUMENTS

| | | | |
|---|---|---|---|
| 0047184 | 10/1982 | European Pat. Off. | |
| 54-58792 | 5/1979 | Japan | 430/281 |
| 57-86832 | 5/1982 | Japan | 204/159.15 |

OTHER PUBLICATIONS

Gessner G. Hawley, Ed., "Polyamide" in *The Condensed Chemical Dictionary*, 10th Ed., Van Nostrand Reinhold Company Inc., New York, New York, 1981, p. 828.

*Primary Examiner*—John E. Kittle
*Assistant Examiner*—Cynthia Hamilton
*Attorney, Agent, or Firm*—Millen & White

[57] ABSTRACT

Photoresists suitable for use for forming relief structures of highly heat-resistant polymers and which contain soluble polymeric precursors which carry radiation-reactive radicals bonded through carboxylic ester groups have an increased light-sensitivity when they also contain at least one radiation-reactive, polymerizable allyl compound which has a boiling point above 180°, the allyl group thereof being bonded via an oxygen, sulfur and/or nitrogen atom. The highly heat-resistant polymers which can be prepared by means of these photoresists have excellent chemical, electrical and mechanical properties.

21 Claims, No Drawings

PHOTORESISTS SUITABLE FOR FORMING RELIEF STRUCTURES OF HIGHLY HEAT-RESISTANT POLYMERS

BACKGROUND OF THE INVENTION

The present invention relates to photoresists which have increased light-sensitivity and are suitable for forming relief structures of highly heat-resistant polymers.

Photoresists for forming relief structures of highly heat-resistant polymers are extensively used in the manufacture of electrical and electronic components, of chemical milling resists and electroplating resists or of printing molds. Photoresists which are highly suitable for these purposes have been described in, for example, German Pat. No. 2,308,830, corresponding to U.S. Pat. No. 3,957,512. These photoresists contain radiation-sensitive polymeric precursors. They are applied to a substrate in the form of a layer or sheet, and the layer or sheet is dried and then irradiated through a negative original. As a result, cross-linking takes place in the irradiated areas and drastically reduces the solubility of the material applied there. The non-irradiated parts of the layer or sheet are then removed in a suitable manner by, e.g., dissolving them out or stripping them off. The remaining relief structures can then be heat-treated to give highly heat-resistant polymers which can withstand temperatures of 250°–400° without adverse effect on edge definition or resolution.

In German Patent No. 2,308,830/U.S. Pat. No. 3,957,512, the soluble polymeric precursors (prepolymers) are polyaddition or polycondensation products of (a) carbocyclic or heterocyclic compounds having two functional groups capable of polyaddition of polycondensation reactions and having radiation-reactive radicals which are bonded through carboxylic ester linkages in the ortho- or peri-position relative to the functional groups (these compounds are referred to below as ring compounds I) and (b) such diamines, diisocyanates, bis-acid chlorides or dicarboxylic acids which can react with these functional groups and which contain at least one cyclic structural element (these (b) compounds are referred to below as ring compounds II).

German Patent No. 2,308,830/U.S. Pat. No. 3,957,512 lists a number of radiation-reactive radicals which are responsible for the crosslinking of the photoresist on irradiation. It has been found, however, that to obtain adequate crosslinking of these photoresists on irradiation with a conventional source of UV rays, irradiation times of about 5 minutes, usually even 8 to 15 minutes, are required. Moreover, these times cannot be significantly shortened by means of conventional photosensitizers.

In German Patent Of Addition No. 2,437,348, corresponding to U.S. Pat. No. Re. 30,186, the photoresists of German Patent No. 2,308,830/U.S. Pat. No. 3,957,512 are modified by incorporating into the ring compounds I, as radiation-reactive groups, oxyalkyl acrylate or oxyalkyl methacrylate groups. This measure shortens the average required irradiation times by about 3 minutes. Nevertheless, even this shorter irradiation period is still too long if photoresists of this type are to be used in the mass production of electronic components. European Patent A No. 47,184 described how the light-sensitivity of photoresists which contain soluble radiation-reactive polyamide-ester resins can be increased by adding, at the same time, radiation-sensitive polymerizable polyfunctional acrylate compounds and aromatic halogen-substituted bisimidazole photoinitiators. While these photoresists are very light-sensitive, the addition of bisimidazole photoinitiators has disadvantages. For instance, the addition of bisimidazole compounds can lead to unwanted, premature polyimide formation in solution, and thereby considerably reduce the stability of the photoresist solution. Furthermore, the halogen substituents can be split off, for example in the course of subsequent hardening of the relief structures at elevated temperatures, and can in turn have an adverse effect on the materials, in particular on the substrates. Moreover, even radiation-sensitive acrylate compounds, in particular those disclosed in European Patent A No. 47,184, tend to polymerize prematurely, which likewise markedly affects the stability of such photoresist solutions.

German Patent Application No. 3,227,584, corresponding to U.S. patent application Ser. No. 516,399, filed July 22, 1983, discloses improved photoresist prepolymers comprising partially etherified alcohols bonded through ester linkages and etherified with allyl alcohol and/or allylthiol.

A need therefore continues to exist for ways to modify these photoresists such that sheets or films prepared therewith have an adequate degree of crosslinking after much shorter irradiation times without, however, adversely affecting the stability of the photoresist solutions, subsequent processing of the photoresists or the properties of the resulting products.

The disclosures of German Patent Nos. 2,308,830, 2,437,348, 2,437,368 and 2,437,422 and German Patent Application 3,227,584, corresponding to U.S. Pat. Nos. 3,957,512, Re. 30,186, 4,045,223 and 4,088,489 and U.S. patent application Ser. No. 516,399, filed July 22, 1983 by the same inventive entity as the present application, respectively, are incorporated herein by reference.

OBJECTS OF THE INVENTION

One object of the present invention is to provide improved photoresists such that sheets or layers prepared therefrom are adequately crosslinked within markedly shorter irradiation times.

Another object of the invention is to provide an improved method of producing relief structures using the photoresists of the invention, whereby significantly shorter irradiation times are required.

Upon further study of the specification and appended claims, further objects and advantages of this invention will become apparent to those skilled in the art.

SUMMARY OF THE INVENTION

These objects can be achieved by providing, in a photoresist comprising a soluble prepolymer being a poly-addition or poly-condensation prepolymer containing radiation-reactive radicals bonded thereto through carboxylic ester linkages, the improvement wherein said photoresist further comprises at least 3% by weight, relative to the weight of said soluble prepolymer, of at least one radiation-reactive polymerizable allyl compound having a boiling point above 180° C., the allyl groups thereof being bonded through an oxygen, sulfur or nitrogen atom.

In a method of use aspect, the invention provides an improved method of forming relief structures wherein the foregoing photoresist is used in place of conventional photoresists and/or the photoresists disclosed in applicants' copending application, thereby decreasing the irradiation time required to cure the prepolymer.

DETAILED DISCUSSION

It has now been found, surprisingly, that much shorter irradiation times are sufficient for such photoresists according to the invention. The chemical, thermal and mechanical resistance of these photoresists, and of the relief structures of highly heat-resistant polymers prepared therefrom, meet high processing requirements when they contain at least one radiation-reactive polymerizable allyl compound which has a boiling point (at atmospheric pressure) above 180° C., the allyl group(s) being bonded via an oxygen, sulfur and/or nitrogen atom. This marked shortening of the necessary duration of irradiation is observed even when only a small amount of radiation-reactive polymerizable allyl compounds which have a boiling point above 180° C., the allyl group(s) being bonded via an oxygen, sulfur and/or nitrogen atom, is added to known soluble polymeric precursors which carry radiation-reactive radicals bonded through carboxylic ester linkages.

The radiation-reactive, polymerizable allyl compounds used as components of the photoresists of the invention to shorten irradiation times and to increase the extent of photopolymerization, are compounds or mixtures of compounds which are preferably liquid, although they can be solid at room temperature, have a boiling point above 180° C., preferably above 200° C. They contain one or more allyl groups bonded to the backbone of the molecule via an oxygen, sulfur and/or nitrogen atom.

If the bridging atom is an oxygen or sulfur atom, the allyl groups can be bonded to the particular backbone molecule through, e.g., ether, thioether, sulfone and/or sulfoxide linkages. Examples of backbone molecules in which one or more hydroxyl groups are replaced by allyloxy, allylthio, allylsulfinyl and/or allylsulfonyl groups and which can optionally be esterified with an acid through a free hydroxyl group include hydroxylic compounds such as mono- or polyhydroxylic aliphatic, alicyclic and aromatic alcohols, and mixtures thereof. Preferred aliphatic polyhydroxylic alcohols are $C_{2-8}$ substituted or unsubstituted straight or branched chain diols or polyols. The carbon chain can also be unsaturated and/or optionally interrupted by hetero atoms, such as oxygen, sulfur or nitrogen. Suitable substituents must not affect the photochemical reaction, and include, e.g., aryl groups, such as phenyl, or keto groups.

Non-limiting examples of such alcohols include ethylene glycol, 1,2- and 1,3-propylene glycol, glycerol, 1,2-, 1,3-, 1,4- and 2,4-butanediol, 1,2,3- and 1,2,4-butanetriol, erythritol, pentahydric alcohols, such as xylitol, hexahydric alcohols, such as sorbitol and mannitol, and also branched alcohols, such as di- and trimethylolethane, di- and trimethylolpropane and pentaerythritol. Phenyl-substituted alcohols of this group are also of interest, for example phenylethylene glycol, 1-phenyl-2,3-dihyroxypropane, 1-phenyl-1,2-dihydroxypropane, 1- or 2-phenylglycerol and 1-phenylbutane-2,4-diol. Aromatic alcohols, e.g., phenol or phenolic compounds, are also preferred, in particular those in which carbon atoms are substituted by heteroatoms, such as, e.g., triazinetriol.

The allyl groups can be bonded via an oxygen or sulfur atom in ether linkages. Suitable such compounds include e.g. mono- and polyallylethers or thioethers derived from mono- or polyhydroxylic alcohols such as mentioned before.

The allyl groups can also be bonded via an oxygen or sulfur atom in ester linkages. Suitable such compounds include, e.g., mono- or polyallyl esters or thioesters of aromatic mono- or polycarboxylic compounds such as benzoic acid, phthalic acid, terephthalic acid, pyromellitic acid and the like.

The allyl groups can also be bonded via a nitrogen atom. Such compounds, in which one to all nitrogen atoms present can be substituted with allyl groups, are preferably derived from five- or six-membered saturated or unsaturated ring systems containing one or more nitrogen atoms and, if appropriate, further heteroatoms, and from their derivatives. Suitable such "backbones" include, e.g., pyrrole, pyrroline, pyrrolidine, pyrazole, pyrazoline, pyrazolidine, imidazole, imidazoline, imidazolidine, oxazolidine, thiazolidine, triazole, piperidine, 1,4-dihydropyridine, piperazine, triazine, isocyanuric acid and derivatives of such nitrogen-containing compounds.

The allyl groups can also be bonded to an amide or imide nitrogen atom. Suitable such compounds include, e.g., amide or imide derivatives of benzoic acid, phthalic acid, terephthalic acid, pyromellitic acid, benzophenone-3,4-dicarboxylic acid, benzophenone-3,4,3',4'-tetracarboxylic acid, fumaric acid, maleic acid and other monocarboxylic or dicarboxylic acids. In these compounds the amide nitrogen atom can carry one or two allyl groups. In dicarboxylic acids one or both acid groups can be present in the amide form; in monoamides the remaining acid group can be esterified.

Specific non-limitative examples of radiation-reactive, polymerizable allyl compounds which are particularly preferred for use in the invention are allyl phenyl ether, glycerol diallyl ether, erythritol triallyl ether, trimethylolpropane diallyl and triallyl ethers, pentaerythritol diallyl, triallyl and tetraallyl ethers, pentaerythritol triallyl ether benzoate, pentaerythritol triallyl ether monophthalate and diphthalate, pentaerythritol triallyl ether monoterephthalate and diterephthalate, pentaerythritol triallyl ether monopyromellitate, dipyromellitate, tripyromellitate and tetrapyromellitate, diallyl sulfoxide, diallyl sulfone, allyl benzoate, monoallyl and diallyl phthalate, monoallyl, diallyl, triallyl and tetraallyl pyromellitate, allyl phenyl thioether, 2,4,6-trisallyloxy-1,3,5-triazine, 2,4-diallyloxyimidazolidine, N-allylpyrrole, N-allylimidazole, N-allylpiperidine, N,N-diallylpiperazine, N,N,N-triallyltriazine, 2,4,6-tris(allylamino)triazine, triallyl-s-triazine-2,4,6-(1H,3H,5H)-trione, hexallyl-melamine, N,N'-diallylpyrromellitic bisimide, N,N'-diallyl benzophenone-3,4,3',4'-tetracarboxylic bisimide, N-allyl-phthalimide, N-monoallylbenzamide, N,N-diallylbenzamide, N,N-diallylfumaric acid monoamide, N,N-diallylmaleic acid monoamide, N,N,N',N'-tetraallylfumaric acid bisamide, the monoethyl ester of N,N-diallylfumaric acid monoamide, and mixtures of these compounds.

Most of these allyl-substituted radiation-sensitive compounds are commercially available.

They also can be obtained from the above mentioned hydroxylic compounds or from the other cited mono- or polyfunctional "backbone"-compounds by etherification, esterification or substitution reactions known per se with suitable allylic compounds. For example, mono- or polyhydroxylic alcohols are reacted with requisite molar amounts of allyl alcohol, allylthiol or allyl halogenides, if appropriate, in the presence of a conventional etherification catalyst or halogenides of suitable structure are reacted with allyl alcohol or allylthiol in the presence of a base. It is also possible to prepare, e.g., partially etherified alcohols by addition of allyl alcohol or allylthiol to non-alcohol precursors, e.g. epoxides, cyclic ethers and the like.

Suitable carboxylic "backbone"-compounds can be reacted with allyl alcohol, allylthiol or allylhalogenides, if appropriate, in presence of conventional esterification catalysts, to form the allyl esters.

The photoresists according to the invention, containing soluble polymeric precursors, also contain at least 3% by weight, preferably at least 10% by weight, more preferably at least 15% by weight, and generally up to about 30% by weight, based on the soluble polymeric precursor, of radiation-reactive, polymerizable allyl compounds; in special cases the amount of radiation-reactive, polymerizable allyl compound added can be greater than 30% by weight. Such amounts may be required, if photoresist layers of unusual thickness are to be cured.

The soluble polymeric precursors contained in the photoresists of the invention are known precursors which can be converted into highly heat-resistant polymers by irradiation and, if appropriate, heat-treatment. Suitable such soluble polymeric precursors are described, e.g., in German Pat. Nos. 2,308,830/U.S. Pat. No. 3,957,512, 2,437,348/U.S. Pat. No. Re. 30,186, 2,437,368/U.S. Pat. No. 4,045,223 and 2,437,422/U.S. Pat. No. 4,088,489 and German Patent Application No. 3,227,584/U.S. Ser. No. 516,399. They are, as a rule, polyaddition or polycondensation products of a ring compound I which contains two radiation-reactive groups bonded through carboxylic ester linkages and two carboxyl, carbonyl chloride, amino, isocyanate or hydroxyl groups suitble for addition or condensation reactions or groups which can be converted by simple reactions into such groups capable of addition or condensation reactions, and a suitable ring compound II having at least one cyclic structural element, such as a diamine, a diisocyanate, a dicarboxylic acid or a bis-acid chloride.

Preferably, ring compounds I are polycarboxylic acids, in particular those having four carboxyl groups, or anhydrides thereof, acid halides and partial esters, such as pyromellitic acid or bicyclo[2.2.2]oct-7-ene-2,3,5,6-tetracarboxylic acid or derivatives thereof, or even dihydroxycarboxylic acids, such as bis-(4-hydroxy-3-carboxyphenyl)methane, or diaminodicarboxylic acids, such as 4,4'-diamino-3,3'-dicarboxybiphenyl. Of these, pyromellitic acid is particularly preferred, because it is readily available and is chemically highly stable. This acid is preferably used in the form of its dianhydride for the syntheses of the soluble polymeric precursors.

Any ring compound II hitherto used is suitable for use as a ring compound II in the soluble polymeric precursors of the invention, but it will be appreciated that the nature of the functional groups depends on the ring compound I groups available for the polyaddition or polycondensation reaction. For example, acid chloride groups in the ring compounds I are preferably reacted with diamines; carboxylic acid groups, amino groups and hydroxyl groups with diisocyanates; amino groups also with bis-acid chlorides; and isocyanate groups with dicarboxylic acids.

Particularly preferred soluble polymeric precursors are polycondensates of a pyromellitic acid derivative which carries two radiation-reactive radicals which are esterified with carboxyl groups, with a diamine which contains at least one cyclic structural element, e.g., 4,4'-diaminodiphenyl ether, 4,4'-diaminodiphenylmethane, 4,4'-diaminodiphenyl sulfone or 2,4-diaminopyridine.

These soluble polymeric precursors contain radiation-reactive radicals bonded through carboxylic ester linkages. These ester groups are also known, e.g., from German Patent Nos. 2,308,830/U.S. Pat. No. 3,957,512, 2,437,348/U.S. Pat. No. Re. 30,186, 2,437,422/U.S. Pat. No. 4,088,489, and from German Patent Application 3,227,584/U.S. Ser. No. 516,399.

The most preferred radiation-reactive radicals are radiation-reactive oxyallyl, oxyalkyl acrylate and oxyalkyl methacrylate groups, such as 2-oxyethyl acrylate or methacrylate groups, which are esterified with carboxyl groups and the ester groups described in German Patent Application No. 3,227,584/U.S. Ser. No. 516,399 and containing allyloxy and/or allylthio groups.

The soluble polymeric precursors contained in the photoresists of the invention generally have weight average molecular weights between 2,000 and 100,000, preferably between 4,000 and 60,000. Preferably, the ratio of carboxylate-linked radiation-reactive radicals to total prepolymer weight is about 1–40 radicals per 10,000 molecular weight units.

The method of preparing the soluble polymeric precursors contained in the photoresists of the invention is likewise knoen, for example from German Patent No. 2,308,830/U.S. Pat. No. 3,957,512, and German Application No. 3,227,584/U.S. Ser. No. 516,399. This method generally first entails esterifying two carboxyl groups in ring compounds I under conditions customary for such reactions with alcohols carrying the radiation-reactive radicals. The resulting diester of ring compound I and the alcohol(s) introducing the radiation-reactive group(s) is then, if appropriate after the functional groups still free have been modified, reacted with a ring compound II in a polyaddition or polycondensation reaction known per se to give the soluble polymeric precursor. These reactions are preferably carried out under the reaction conditions described in the abovementioned references. The soluble polymeric precursor is separated out of the reaction mixture in a conventional manner, for example by precipitating it by means of water, filtering off the precipitate and, if necessary, thoroughly washing out unwanted by-products.

These soluble polymeric precursors and the radiation-reactive, polymerizable allyl compounds which are to be added according to the invention, are processed into the photoresists of the invention in a manner known per se. These photoresists, in addition to a suitable solvent, the soluble polymeric precursor and the allyl compound(s), can contain further additives known and customary in this technology. Suitable such additives include, e.g., fillers, photosensitizers, such as, for example, 4,4'-bis(dimethylamino)benzophenone (Michler's ketone), 4,4'-bis(diethylamino)benzophenone, benzoin ether, or anthraquinone or thioxanthone derivatives, and also copolymerizable, radiation-sensitive maleimides, such as, for example N-phenylmaleimide, dyestuffs, pigments, plasticizers, tackifiers, such as, for example, vinylsilanes, thermally activated initiators which form free radicals, and also a very great variety of other polymers and resins, stabilizers and surface-active compounds which, in certain circumstances, can contribute to improving the film-forming or coating properties and/or to improving the adhesion of the films applied to the substrates, and also for improving the mechanical strength, the chemical resistance and the flow-life of the material, but also for affecting the viscosity of the photoresists. Such additives can be added in an amount of 0 to 15% by weight, based on the solids content.

Suitable solvents for dissolving the soluble polymeric precursors and the above-mentioned constituents of the photoresists include, e.g.: ethylene glycol; glycol ethers, such as glycol monomethyl ether, glycol dimethyl ether and glycol monoethyl ether; aliphatic esters, such as ethyl acetate, hydroxyethyl acetate, alkoxyethyl acetate, n-butyl acetate or amyl acetate; ethers, such as dioxane; ketones, such as methyl ethyl ketone, methyl isobutyl ketone, cyclopentanone and cyclohexanone; polar aprotic solvents, such as dimethylformamide, dimethylacetamide, hexamethylphosphoric triamide, N-methylpyrrolidone and butyrolactone; and mixtures of such solvents. These solutions generally contain 5 to 60%, preferably up to 50%, of solids.

The photoresists of the invention can be conventionally applied to any conventional substrate, in particular to the surface of thermally oxidized and/or aluminum-coated silicon materials which can, if desired, also be doped, and any other substrate conventional in semiconductor technology, e.g., silicon nitride, gallium arsenide or indium phosphide. Other suitable substrates are those known from liquid crystal display manufacture, such as glass or indium tin oxide, metal plates and foils, e.g., made of aluminum, copper or zinc, bimetal and trimetal foils, but also electrically non-conductive foils on which metals have been vapor-deposited, $SiO_2$ materials which may have been coated with aluminum, or paper. These substrates can be thermally pretreated, surface-roughened or incipiently etched, or chemically treated to increase their hydrophilic character.

The photoresist layers can be applied to a substrate in various thicknesses. The layer thickness most favorable in a particular case depends on various factors, e.g., the specific use for which the material being prepared is intended, the polymeric precursor used in the particular case, and the nature of the other components which can, if desired, also be present in the radiation-sensitive layer. As a rule, it has been found to be preferably for the resist layers to have a thickness of about 0.1 $\mu$m to about 20 $\mu$m.

The photoresists can be applied to the clean surface of the substrates by spraying, flow-coating, roller-coating, spin-coating or dip-coating, and afterwards the solvent is removed by evaporation, so that a radiation-sensitive layer remains behind on the surface of the substrate. The removal of the solvent can be accelerated if desired, by heating the layer to temperatures of up to 100°. The photoresist layer is then exposed to radiation which causes the radiation-reactive groups to react and crosslink the layer. It is conventional to use actinic radiation, but high-energy radiation, such as X-rays or electron beams are also suitable.

The irradiation or exposure can take place through a mask original, but it is also possible to guide a collimated beam of radiation over the surface of the radiation-sensitive layer. The irradiation is customarily carried out with UV lamps which emit radiation having a wavelength of 200 to 500 nm and an intensity of 0.5 to 60 mW/cm$^2$. An image pattern is developed in the layer by treating the layer with a developer liquid which removes the non-irradiated areas of the photoresist material, thereby exposing portions of the substrate.

The developer solution used is, as a rule, a mixture of one or more solvents specified for preparing the photoresist together with a precipitant. Examples of typical developer solutions are 4-butyrolactone/toluene, dimethylformamide/ethanol, dimethylformamide/methanol, methyl ethyl ketone/ethanol and methyl i-butyl ketone-/i-propanol, each in a ratio of 2:1 to 1:4. After a short period of irradiation, often 3–4 times shorter than needed for the corresponding photoresists without the addition, according to the invention, of at least one allyl compound, developing, washing and drying gives sharp-edged resist images which have a resolution of less then 3 $\mu$m and which can be converted into highly heat-resistant polymers by heat-treatment at 200° to 400° C.

In general, addition of at least 3% by weight, relative to the weight of soluble prepolymer, of at least one radiation-reactive polymerizable allyl compound, according to the invention, will permit a reduction of at least about 50%, preferable 70%, and more preferably 80% in the curing time necessary for the photoresist in order to produce a well-resolved, sharp-edged relief structure. It will be appreciated that the improvement in curing times will depend upon the amount of added allyl compound, as well as the thickness of the photoresist layer, the type and intensity of curing radiation, the desired resolution, and other factors which are well known to those skilled in this art.

These highly heat-resistant polymers have excellent chemical, electrical and mechanical properties. The photoresists of the invention are thus particularly suitable for, e.g., preparing protective layers on semiconductor elements, dielectrical layers in multilayered integrated circuits, or for use as a final passivating layer on electrical devices and as an orientation layer of liquid crystal diaplay cells.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

(a) Photoresist
- 5 g of a polymeric precursor (obtained by reacting pyromellitic dianhydride with 2-hydroxyethyl methacrylate and then with thionyl chloride and 4,4'-diaminodiphenyl ether, as in German Pat. No. 2,437,348/U.S. Pat. No. Re. 30,186),
- 0.25 g of N-phenylmaleimide,
- 0.1 g of Michler's ketone,
- 0.05 g of vinyltrimethoxysilane and
- 0.5 g of pentaerythritol triallyl ether are dissolved in 13.5 ml of dimethyl acetamide.

(b) Use
- A substrate with an $SiO_2$ surface is spin-coated with the photoresist of (a) and dried by heating. The resulting 1.5 $\mu$m thick film is then contact-irradiated under nitrogen by means of a 200 Watt UV lamp shining through a line grid for 50 seconds with an intensity of 5–6 mw/cm$^2$.
- The non-irradiated parts of the photoresist are then washed out by developing with a mixture of equal parts of volume of toluene and 4-butyrolactone to give a sharp-edged image having a resolution of less than 3 μm.

EXAMPLE 2

(a) Photoresist 5 g of a polymeric precursor (obtained by reacting pyromellitic dianhydride with 2-hydroxyethyl methacrylate and then with thionyl chloride and 4,4'-diaminodiphenyl ether, as in German Pat. No. 2,437,348/U.S. Pat. No. Re. 30,186),
0.25 g of N-phenylmaleimide,
0.1 g of Michler's ketone,
0.05 g of vinyltrimethoxysilane and
1 g of pentaerythritol triallyl ether are dissolved in 13.5 ml of dimethyl acetamide.

(b) Use

Irradiation as in Example 1(b) for 35 seconds gives an equally sharp image, having a resolution of less than 3 μm.

EXAMPLES 3 TO 18

The following photoresists are prepared as in Example 1:

5 g of a polymeric precursor (as described in Example 1)
0.25 g of N-phenylmaleimide,
0.1 g of Michler's ketone,
0.05 g of vinyltrimethoxysilane and
1 g of radiation-reactive, polymerizable allyl compounds are dissolved in 13.5 ml of dimethylformamide.

The following are used as radiation-reactive, polymerizable allyl compounds:

Example 3—Allyl phenyl ether.
Example 4—Glycerol diallyl ether.
Example 5—A mixture of pentaerythritol diallyl, triallyl and tetraallyl ethers.
Example 6—Pentaerythritol triallyl ether diester of pyromellitic acid.
Example 7—A mixture of the pentaerythritol triallyl ether triester and tetraester of pyromellitic acid.
Example 8—Allyl phenyl thioether.
Example 9—Diallyl sulfoxide.
Example 10—Diallyl sulfone.
Example 11—2,4,6-Trisallyloxy-1,3,5-triazine.
Example 12—Triallyl-s-triazine-2,4,6-(1H,3H,5H)-trione.
Example 13—Allylimidazole.
Example 14—N-allylbenzamide.
Example 15—N,N-diallyl-benzamide.
Example 16—N,N-diallylmaleic acid monoamide.
Example 17—N,N-diallylfumaric acid monoamide monoethyl ester.
Example 18—N,N,N',N'-tetraallylfumaramide.

Used as in Example 1(b), all these photoresists produce on irradiation sharp images having a resolution of less than 3 μm.

EXAMPLE 19

(a) Preparation of the polymeric precursor (prepolymer):

A solution of 18.5 g of pyromellitic dianhydride, 8.7 g of pentaerythritol triallyl ether and 17.6 g of 2-hydroxyethyl methacrylate in 200 ml of tetrahydrofuran is gradually admixed at room temperature, with stirring and water-cooling, with 28 ml of pyridine, and the reaction mixture is left to stand for 3 days at room temperature. 12 ml of thionyl chloride are then slowly added dropwise at −10° to −15° with vigorous stirring, which is afterwards continued for 3 hours at the same temperature. A solution of 13.5 g of 4,4'-diaminodiphenyl ether in 65 ml of dimethylacetamide is then added dropwise at −10° to −15°. The mixture is stirred overnight at room temperature, and is then admixed with a little acetyl chloride as well as with about 50 ml of ethanol. The solution is left to stand overnight and is then stirred into 4 liters of water, and the prepolymer is filtered off with suction, washed with water and dried in vacuo.

About 80% of the radiation-reactive radicals bonded through carboxylic ester linkages in this prepolymer derive from 2-hydroxyethyl methacrylate and about 20% from pentaerythritol triallyl ether.

(b) Photoresist 5 g of the polymeric precursor of (a),
0.25 g of N-phenylmaleimide,
0.1 g of Michler's ketone,
0.05 g of vinyltrimethoxysilane and
0.5 g of pentaerythritol triallyl ether are dissolved in 13.5 ml of dimethyl acetamide.

Used as in Example 1(b), the photoresist produces on irradiation for 30 seconds a sharp image having a resolution of less than 3 μm.

COMPARATIVE EXAMPLE

The following, known photoresist is prepared analogously to Example 1:

5 g of a polymeric precursor (as described in Example 1),
0.25 g of N-phenylmaleimide,
0.1 g of Michler's ketone and
0.05 g of vinyltrimethoxysilane
are dissolved in 13.5 ml of dimethylacetamide.

Used as in Example 1(b), the photoresist needs to be irradiated longer, for at least 180 seconds, to produce a sharp image. Irradiation for only 50 seconds gives an unsatisfactory result showing a relief structure with increased deformability, loss of resolution and lack of sharpness.

In comparison with Example 1, it is seen that incorporation of 10% by weight of a radiation-reactive polymerizable allyl compound boiling above 180° C., according to the invention, results in a 72% reduction in curing time for comparable resolution and sharpness.

The preceding examples can be repeated with similar success by substituting the generically or specifically described reactants and/or operating conditions of this invention for those used in the preceding examples. From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a photoresist comprising a soluble polyamide-ester prepolymer containing radiation-reactive radicals bonded to the repeating unit of the prepolymer through carboxylic ester linkages; said amide having the structure of the reaction product of a carboxylic aid and an amine, the improvement wherein said photoresist further comprises at least 3% by weight, relative to the weight of said soluble prepolymer, of at least one radiation-reactive polymerizable allyl compound having a boiling point above 180° C., the allyl groups thereof being bonded through an oxygen, sulfur or nitrogen atom.

2. The photoresist of claim 1, wherein said allyl compound is a derivative of an hydroxylic compound, one or more hydroxyl groups of which are replaced by allyloxy, allylthio, allylsulfinyl or allylsulfonyl groups or a mixture thereof.

3. The photoresist of claim 2, wherein said hydroxylic compound is a $C_{2-8}$ unsubstituted or keto- or phenyl-substituted straight or branched chain aliphatic diol or polyol.

4. The photoresist of claim 3, wherein said hydroxylic compound is ethylene glycol, 1,2- or 1,3-propylene glycol, glycerol, 1,2-, 1,3-, 1,4 or 2,4-butanediol, 1,2,3- or 1,2,4-butanetriol, erythritol, xylitol, sorbitol, mannitol, dimethylolethane, trimethylolethane, pentaerythritol, phenylethylene glycol, 1-phenyl-2,3-dihydroxypropane, 1-phenyl-1,2-dihydroxypropane, 1- or 2-phenylglycerol, 1-phenylbutane-2,4-diol, dimethylolpropane, trimethylolpropane or a mixture thereof.

5. The photoresist of claim 2, wherein at least one of said hydroxyl groups is esterified with an acid.

6. The photoresist of claim 1, wherein said allyl compound is a mono- or polyester or thioester of benzoic acid, phthalic acid, terephthalic acid or pyromellitic acid with allyl alcohol or allylthiol.

7. The photoresist of claim 1, wherein said allyl compound is a derivative of a saturated or unsaturated five- or six-membered heterocyclic amine, one or more nitrogen atoms of which are substituted with an allyl group.

8. The photoresist of claim 7, wherein said heterocyclic amine is pyrrole, pyrroline, pyrrolidine, pyrazole, pyrazoline, pyrazolidine, imidazole, imidazoline, imidazolidine, oxazolidine, thiazolidine, triazole, piperidine, 1,4-dihydropyridine, piperazine, triazine or isocyanuric acid.

9. The photoresist of claim 1, wherein said allyl compound is an N-allyl substituted amide or imide.

10. The photoresist of claim 1, wherein said allyl compound is allyl phenyl ether, glycerol diallyl ether, erythritol triallyl ether, trimethylolpropane diallyl and triallyl ethers, pentaerythritol diallyl, triallyl and tetraallyl ethers, pentaerythritol triallyl ether benzoate, pentaerythritol triallyl ether monophthalate and diphthalate, pentaerythritol triallyl ether monoterephthalate and diterephthalate, pentaerythritol triallyl ether monopyromellitate, dipyromellitate, tripyromellitate and tetrapyromellitate, diallyl sulfoxide, diallyl sulfone, allyl benzoate, monoallyl and diallyl phthalate, monoallyl, diallyl, triallyl and tetraallyl pyromellitate, allyl phenyl thioether, 2,4,6-trisallyloxy-1,3,5-triazine, 2,4-diallyloxyimidazolidine, N-allylpyrrole, N-allylimidazole, N-allylpiperidine, N,N-diallylpiperazine, N,N,N-triallyltriazine, 2,4,6-tris(allylamino)triazine, triallyl-s-triazine-2,4,6-(1H,3H,5H)-trione, hexaallylmelamine, N,N'-diallylpyromellitic bisimide, N,N'-diallyl benzophenone-3,4,3',4'-tetracarboxylic bisimide, N-allylphthalimide, N-monoallylbenzamide, N,N-diallylbenzamide, N,N-diallylfumaric acid monoamide, N,N-diallylmaleic acid monoamide, N,N,N',N'-tetraallylfumaric acid bisamide, the monoethyl ester of N,N-diallylfumaric acid monoamide or a mixture thereof.

11. The photoresist of claim 1, wherein said allyl compound has a boiling point above 200° C.

12. The photoresist of claim 1, wherein the amount of said allyl compound is at least 10% by weight relative to the weight of said soluble prepolymer.

13. The photoresist of claim 12 wherein said amount is at least 15% by weight.

14. The photoresist of claim 1, wherein the amount of said allyl compound is between 3 and 30% by weight relative to the weight of said soluble prepolymer.

15. In a process for forming relief structures of highly heat-resistant polymers, comprising the steps of applying a photoresist comprising a soluble polyamide-ester prepolymer containing radiation-reactive radicals bonded to the repeating unit of the prepolymer through carboxylic ester linkages, said amide having the structure of the reaction product of a carboxylic acid and an amine, said photoresist being applied in the form of a layer or sheet to a substrate, drying the layer or sheet, irradiating the dried, radiation-sensitive layer or sheet through a negative original or using a guided collimated beam, dissolving out or stripping off the non-irradiated portions of the layer or sheet to form a relief structure, the improvement wherein said photoresist further comprises at least 3% by weight, relative to the weight of said soluble prepolymer, of at least one radiation-reactive polymerizable allyl compound having a boiling point above 180° C., the allyl groups thereof being bonded through an oxygen, sulfur or nitrogen atom.

16. The process of claim 15, wherein said allyl compound has a boiling point above 200° C.

17. The process of claim 15, wherein the amount of said allyl compound is at least 10% by weight relative to the weight of said soluble prepolymer.

18. The process of claim 15, wherein said allyl compound is allyl phenyl ether, glycerol diallyl ether, erythritol triallyl ether, trimethylolpropane diallyl and triallyl ethers, pentaerythritol diallyl, triallyl and tetraallyl ethers, pentaerythritol triallyl ether benzoate, pentaerythritol triallyl ether monophthalate and diphthalate, pentaerythritol triallyl ether monoterephthalate and diterephthalate, pentaerythritol triallyl ether monopyromellitate, dipyromellitate, tripyromellitate and tetrapyromellitate, diallyl sulfoxide, diallyl sulfone, allyl benzoate, monoallyl and diallyl phthalate, monoallyl, diallyl, triallyl and tetraallyl pyromellitate, allyl phenyl thioether, 2,4,6-trisallyloxy-1,3,5-triazine, 2,4-diallyloxyimidazolidine, N-allylpyrrole, N-allylimidazole, N-allylpiperidine, N,N-diallylpiperazine, N,N,N-triallyltriazine, 2,4,6-tris(allylamino)triazine, triallyl-s-triazine-2,4,6-(1H,3H,5H)-trione, hexaallylmelamine, N,N'-diallylpyromellitic bisimide, N,N'-diallyl benzophenone-3,4,3',4'-tetracarboxylic bisimide, N-allylphthalimide, N-monoallylbenzamide, N,N-diallylbenzamide, N,N-diallylfumaric acid monoamide, N,N-diallylmaleic acid monoamide, N,N,N',N'-tetraallylfumaric acid bisamide, the monoethyl ester of N,N-diallylfumaric acid monoamide or a mixture thereof.

19. A relief structure formed by the process of claim 15.

20. A method of reducing the irradiation time of a photoresist comprising a soluble polyamide-ester prepolymer containing radiation-reactive radicals bonded to the repeating unit of the prepolymer through carboxylic ester linkages, said amide having the structure of the reaction product of a carboxylic acid and an amine, comprising incorporating in said photoresist at least 3% by weight, relative to the weight of said soluble prepolymer of at least one radiation-reactive polymerizable allyl compound having a boiling point above 180° C., the allyl groups thereof being bonded through an oxygen, sulfur or nitrogen atom.

21. The process of claim 15, wherein the resultant relief structure is heat-treated.

* * * * *